(12) United States Patent
Sjolund et al.

(10) Patent No.: US 8,976,824 B2
(45) Date of Patent: Mar. 10, 2015

(54) HEAT-SWAP DEVICE AND METHOD

(71) Applicant: Finisar Corporation, Sunnyvale, CA (US)

(72) Inventors: T. H. Ola Sjolund, Morgan Hill, CA (US); Idan Mizrahi, Fremont, CA (US)

(73) Assignee: Finisar Corporation, Sunnyvale, CA (US)

( * ) Notice: Subject to any disclaimer, the term of this patent is extended or adjusted under 35 U.S.C. 154(b) by 77 days.

(21) Appl. No.: 13/763,517

(22) Filed: Feb. 8, 2013

(65) Prior Publication Data

US 2013/0208745 A1    Aug. 15, 2013

Related U.S. Application Data

(60) Provisional application No. 61/597,106, filed on Feb. 9, 2012.

(51) Int. Cl.
H01S 3/04 (2006.01)
H01S 5/022 (2006.01)
H01S 5/024 (2006.01)
H01S 5/00 (2006.01)
H01S 5/0683 (2006.01)

(52) U.S. Cl.
CPC .............. *H01S 3/04* (2013.01); *H01S 5/02248* (2013.01); *H01S 5/02438* (2013.01); *H01S 5/02453* (2013.01); *H01S 5/0085* (2013.01); *H01S 5/02284* (2013.01); *H01S 5/0683* (2013.01)
USPC ............................................. 372/34

(58) Field of Classification Search
CPC . G02B 6/4266; H01S 5/0085; H01S 5/02248; H01S 5/02438; H01S 5/02453; H01S 5/04; H01S 3/04
USPC .................................................. 372/34
See application file for complete search history.

(56) References Cited

U.S. PATENT DOCUMENTS

2006/0262818 A1*  11/2006  Kumar et al. ................... 372/34

* cited by examiner

*Primary Examiner* — Tuan Nguyen
(74) *Attorney, Agent, or Firm* — Maschoff Brennan

(57) ABSTRACT

A TOSA can include: a light emitting element; and one or more heating elements thermally coupled to the light emitting element so as to provide a substantially constant heat generation profile and/or temperature profile across the TOSA during a light emitting element dormant period and a light emitting element firing period. The TOSA can include a controller operably coupled with the one or more heating elements so as to control the substantially constant heat generation profile and/or temperature profile. In one aspect, the one or more heating elements can include one or more dedicated heating elements. In one aspect, the one or more of the dedicated heating elements can include a resistor element or coil.

18 Claims, 7 Drawing Sheets

HEAT-SWAP DEVICE AND METHOD

CROSS-REFERENCE TO RELATED APPLICATIONS

This patent application claims the benefit of U.S. Provisional Application No. 61/597,106 filed Feb. 9, 2012, which provisional application is incorporated herein by specific reference in its entirety.

BACKGROUND

One common difficulty associated with an active functional system of a laser transceiver, or a subsystem apparatus of any sort either monolithic, hybrid, or the like, includes uneven or inconsistent heat generation during operation of the transceiver. Here by uneven we mean a spatially non-uniform heat generation. By inconsistent, here we mean a temporally non-uniform heat generation. Both of these non-uniformities can lead to temperature gradients between various components in the transceiver. These temperature gradients can be transient or constant in time. Particularly, the problem of uneven or inconsistent heat generation can be problematic in a laser transmitter optical sub-assembly (TOSA), such as a chirp managed laser TOSA. The uneven or inconsistent heat generation can result in a temperature difference between various elements in the system to the point where functional operation and required performance is compromised. Generally, TOSAs are well known in the art.

A change in temperature can occur in a transmitter module due to the heat that is generated from firing of a light source, such as a laser, followed by dormant periods where no heat is generated by the laser. The dip in operational temperature between laser firings, such as when the laser is dormant, can cause heat gradient fluctuations throughout the transmitter module and across the various elements of the module, which may alter performance characteristics of the laser and overall TOSA. Often the performance of the TOSA can be diminished due the heat gradient that occurs when the laser is dormant. Any alteration in performance characteristics of the laser can be unfavorable for reliability, durability, consistency or any other type of functional requirement.

Therefore, there remains a need to mitigate changes in heat and/or temperature gradients within a transceiver module or overall TOSA, such as within a CML TOSA. Generally, CML TOSAs are well known in the art.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

In one embodiment, a TOSA can include: a light emitting element; and one or more heating elements thermally coupled to the light emitting element so as to provide a substantially constant heat generation profile and/or temperature profile across the TOSA during a light emitting element dormant period and a light emitting element firing period. The TOSA can include a controller operably coupled with the one or more heating elements so as to control the substantially constant heat generation profile and/or temperature profile. In one aspect, the one or more heating elements can include one or more dedicated heating elements. In one aspect, the one or more of the dedicated heating elements can include a resistor element or coil.

In one embodiment, the one or more of the heating elements can be in contact with or adjacent to the light emitting element. In one aspect, one or more of the heating elements can be within 1 cm of the light emitting element, or within 5 mm, or within 2 mm, or within 1 mm, or within 0.5 mm, or within 0.25 mm, or within 0.1 mm.

In one embodiment, the TOSA can include one or more TOSA electronic components that are common in TOSAs, and one or more of the heating elements can be thermally coupled to the one or more electronic components. The thermally coupling can be in contact or adjacent, or within 1 cm, or within 5 mm, or within 2 mm, or within 1 mm, or within 0.5 mm, or within 0.25 mm, or within 0.1 mm.

In one embodiment, the TOSA can include one or more thermocouples operably coupled with the controller. The thermocouples can provide thermocouple data to the controller. When multiple controllers are used, the thermocouple data can be provided to the multiple controllers. Each controller can control heating of one or more heating elements. In one aspect, the one or more thermocouples are in contact with or adjacent to the one or more heating elements.

In one embodiment, the TOSA can include one or more thermoelectric coolers with one or more of the heating elements thermally coupled with the one or more thermoelectric coolers. The heating elements can be heated and adjusted to provide heat to counteract cooling by the thermoelectric coolers, such as when the laser is ramping down or dormant. The one or more thermoelectric coolers can be in contact with or adjacent to the one or more heating elements, or within 1 cm, or within 5 mm, or within 2 mm, or within 1 mm, or within 0.5 mm, or within 0.25 mm, or within 0.1 mm. In one embodiment, a method of controlling temperature of a TOSA can include: heating one or more heating elements so as to provide a substantially constant heat generation profile and/or temperature profile across the TOSA during a light emitting element dormant period and a light emitting element firing period.

In one embodiment, the temperature control method can include: emitting light from a light emitting element during the light emitting element firing period; ending the light emitting element firing period so that the light emitting element begins to cool during the light emitting element dormant period; and activating the one or more heating elements during the light emitting element dormant period so as to maintain the substantially constant heat generation profile and/or temperature profile across the TOSA.

In one embodiment, the temperature control method can include identifying the substantially constant heat generation profile and/or temperature profile across the TOSA; and adjusting heat emitted from the one or more heating elements during the light emitting element dormant period and/or a light emitting element firing period so as to maintain the substantially constant heat generation profile and/or temperature profile across the TOSA.

In one embodiment, the temperature control method can include: turning on the TOSA; heating the one or more heating elements so as to obtain the substantially constant heat generation profile and/or temperature profile across the TOSA prior to a first light emitting element firing period; and firing a light emitting element after reaching the substantially constant heat generation profile and/or temperature profile across the TOSA.

In one embodiment, the temperature control method can include firing a light emitting element during a first light emitting element firing period so as to provide the substantially constant heat generation profile and/or temperature profile across the TOSA; and mapping the substantially constant heat generation profile and/or temperature profile across the TOSA.

In one embodiment, the temperature control method can include: monitoring a first heat generation profile and/or temperature profile across the TOSA; and adjusting heat emitted from the one or more heating elements during the light emitting element dormant period and/or a light emitting element firing period so as to maintain the substantially constant heat generation profile and/or temperature profile across the TOSA.

In one embodiment, the temperature control method can include: firing a light emitting element at a steady state firing period; identifying the substantially constant heat generation profile and/or temperature profile across the TOSA at the steady state; and adjusting heat emitted from the one or more heating elements during a non-steady state firing period so as to maintain the substantially constant heat generation profile and/or temperature profile across the TOSA.

In one embodiment, the temperature control method can include: adjusting heat emitted from the one or more heating elements so as to maintain heat load on a thermoelectric cooler and maintain the substantially constant heat generation profile and/or temperature profile across the TOSA during the light emitting element dormant period and the light emitting element firing period.

In one embodiment, a method of controlling temperature of a TOSA can include: providing the TOSA having one or more heating elements thermally coupled with a light emitting element, one or more thermocouples, and one or more controllers; firing the light emitting element during a steady state light emitting element firing period; measuring with the one or more thermocouples a heat generation profile and/or temperature profile across the TOSA during the steady state light emitting element firing period; providing thermocouple data from the one or more thermocouples to the one or more controllers during the steady state light emitting element firing period; identifying a substantially constant heat generation profile and/or temperature profile across the TOSA at the steady state light emitting element firing period; and heating one or more heating elements under control of the one or more controllers so as to provide a substantially constant heat generation profile and/or temperature profile across the TOSA during non-steady state light emitting element firing period or a light emitting element dormant period.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and following information as well as other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
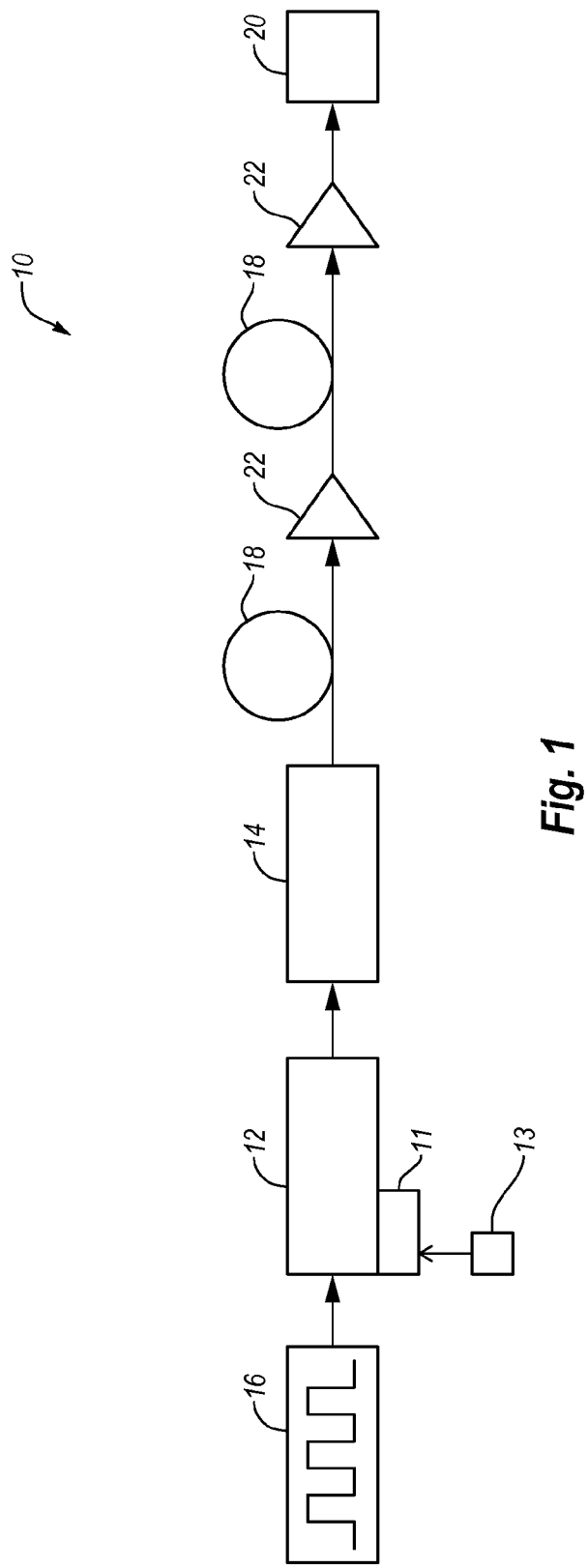
FIG. 1 illustrates an embodiment of an optical communication system having a single heating element.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting.

Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Generally, the invention includes an optoelectronic device having one or more heating elements that are each configured to heat the optoelectronic device to maintain a consistent temperature profile across the optoelectronic device. The consistent temperature profile can include having the same temperature at multiple components of the optoelectronic device as well as a consistent temperature gradient profile across a plurality of the components. The heating elements can be provided at one or more selected locations in order to provide heat to one or more select components of the optoelectronic device when the laser heat source is not firing or providing sufficient heat. The heating elements can warm the optoelectronic device before and after laser firing so that the optoelectronic device maintains the consistent temperature profile before, during, and after laser firing. In one example, the heating elements can be activated to provide heat and the consistent temperature profile similarly to the heat provided by the firing laser. When the laser is firing, the laser provides a certain consistent temperature profile, especially when a steady state temperature profile is achieved, but when the laser is dormant, in a transient state, or firing periodically the laser firing may not be sufficient to maintain a consistent temperature profile across the optoelectronic device. Now, the one or more heating elements can be selectively located and selectively heated in order to maintain a substantially consistent temperature profile across the optoelectronic device during periods when the laser is not providing the substantially consistent temperature profile. As such, the heaters alone when the laser is not firing or in combination with the heat from laser firing can provide the substantially consistent temperature profile across the optoelectronic device.

The one or more heaters in the optoelectronic device can be activated in order to compensate for a slow temperature transient time between laser firing as well as during a dormant period between laser firings in order to have a substantially consistent temperature profile across the optoelectronic device. Accordingly, the one or more heating elements can be configured, arranged, and controlled to provide a substantially constant heat and/or temperature gradient across the optoelectronic device before, during, and after firing of the laser as well as during a dormant period between laser firings and during ramping up or ramping down of laser firing activity. Accordingly, the one or more heaters can be activated in order to maintain a substantially steady state with regard to the heat and/or temperature gradient across the optoelectronic device while the laser is not in a steady state operational modality. The optoelectronic device can include the one or more heater elements integrated with, or thermally coupled with the semiconductor of the light emitting device (e.g., laser) that generates heat during operation. Also, the optoelectronic device can include the one or more heater elements located, arranged or otherwise distributed and thermally coupled with the light emitting device so as to provide for a constant heat gradient before, during and after filing of the light emitting device.

Example embodiments can include any optical transmitter having one or more heating elements configured, located, or arranged as described herein. In another example, some embodiments relate to a DFB (Distributed Feed Back) laser having thermal wavelength (WL) dependent compensation by having one or more heater elements integrated, associated, and/or thermally coupled with the laser. In yet another example, some embodiments can include a CML laser having one or more heater elements integrated, associated, and/or thermally coupled with the laser such that a substantially constant heat gradient can be achieved before, during, and after firing of the CML laser as well as during a dormant period between laser firings. For example, the one or more heating elements configured to provide a substantially consistent heat and/or temperature gradient across the optoelectronic device can solve a major problem with CML lasers where the laser has a fast turn on (e.g., e.g., <2 ms; called 'disable negate') by providing the optoelectronic device with the substantially consistent heat and/or temperature gradient so that the CML laser is pre-heated at the time of fast turn on firing. The one or more heaters configured as described herein can be employed with CML 30 km 32×FC and CML 80 km 100G as well as others.

Generally, the embodiments of the present invention having the one or more heating elements configured to provide a substantially consistent heat and/or temperature gradient across the optoelectronic device can be practiced in: U.S. Ser. No. 13/272,261 (Optical Transmitter with Tunable Chirp); U.S. Ser. No. 61/533,452 (THERMAL CHIRP COMPENSATION OF A VCSEL BASED OPTICAL TRANSMITTER); U.S. Pat. No. 7,542,683 (Chirp Managed Laser (CML) Transmitter; U.S. Pat. No. 7,505,694 (THERMAL CHIRP COMPENSATION SYSTEMS FOR A CHIRM MANAGED DIRECTLY MODULATED LASER (CML) DATA LINK); U.S. Pat. No. 7,639,995 (METHOD AND APPARATUS FOR TRANSMITTING A SIGNAL USING A CHIRP MANAGED LASER (CML) AND AN OPTICAL SPECTRUM RESHAPER (OSR) BEFORE AN OPTICAL RECEIVER); U.S. Pat. No. 7,376,352 (CHIRP MANAGED LASER FIBER OPTIC SYSTEM INCLUDING AN ADAPTIVE RECEIVER); U.S. Pat. No. 8,068,742 (PHASE SHIFT KEYED MODULATION OF OPTICAL SIGNAL USING CHIRP MANAGED LASER); AND U.S. Pat. No. 7,502,532 (MULTI-RING RESONATOR IMPLEMENTATION OF OPTICAL SPECTRUM RESHAPER FOR CHIRP MANAGED LASER TECHNOLOGY), which patents and patent applications are incorporated herein by specific reference in their entirety. However, the embodiments of the present invention can be practiced in other types of lasers, laser modules, or TOSAs other than CML TOSAs.

In one embodiment, the TOSA can include various electronic components operably coupled or otherwise associated with the laser, any of which may be used for the one or more heating elements. The various electronic components can be those described herein or generally known or used in optoelectronic devices, such as a TOSA. As such, the various electronic components can be considered as the one or more heating elements as described herein and can be configured, arranged, and controlled to provide a substantially constant heat and/or temperature gradient across the TOSA device before, during, and after firing of the laser of the TOSA as well as during a dormant period between laser firings. While the heating element could include any electronic component that can generate heat at a consistent amount to provide a substantially constant heat and/or temperature gradient across the TOSA device before, during, and after firing of the laser of the TOSA as well as during a dormant period between laser firings, a particular example includes one or more dedicated resistive elements, such a resistor element or coil to provide the substantially constant heat or temperature gradient. Accordingly, the TOSA can include one or more dedicated heating resistor elements or coils configured, arranged, and controlled to provide a substantially constant heat and/or temperature gradient across the TOSA device before, during, and after firing of the laser of the TOSA as well as during a dormant period between laser firings.

The one or more heating elements can, alone or in combination, include a dedicated controller or driver for providing the substantially constant heat and/or temperature gradient across the TOSA device before, during, and after firing of the laser of the TOSA as well as during a dormant period between laser firings. On the other hand, a controller and/or driver that controls and/or drives any of the various electronic components of the TOSA can be operably coupled with the one or more heating elements, such as the resistor element or coil in order to provide the substantially constant heat and/or temperature gradient.

In one embodiment, a method of managing a heat or temperature gradient using a controller and/or driver can be provided that operates the one or more heating elements in order to provide the substantially constant heat and/or temperature gradient across the TOSA device before, during, and after firing of the laser of the TOSA as well as during a dormant period between laser firings. Such a method can include controlling and/or driving the one or more heating elements in order to provide the substantially constant heat and/or temperature gradients. The method can include independently or cooperatively controlling and/or driving the one or more heating elements to be: (1) turned on and generating heat; (2) set at a certain heat generation level; (3) set at a certain temperature level; and/or (4) turned off and not generating heat.

In one embodiment, the one or more heating elements can be operably coupled to one or more thermocouples arranged with respect to the TOSA such that the heat and/or temperature gradient can be monitored and thereby controlled in accordance with the principles described herein. The one or more thermocouples can obtain heat and/or temperature data that can be used for controlling the one or more heating elements. As such, the thermocouples can facilitate a feedback loop to provide the appropriate temperature or heat data so that the controller can control the one or more heating elements in order to provide the substantially constant heat and/or temperature gradient.

In one embodiment, the TOSA can be configured with the one or more thermocouples in relation with the one or more heating elements such that a heat generation map and/or temperature map can be generated for the TOSA. The heat generation map and/or temperature map can be provided to a controller and/or driver in order to cause a substantially constant heat generation map and/or temperature map to be obtained across the TOSA device before, during, and after firing of the laser of the TOSA as well as during a dormant period between laser firings. For example, the heat generation map and/or temperature map can be used to modulate the heat generated by the one or more heaters during a ramp up or ramp down of laser firing so that the TOSA maintains the substantially constant heat and/or temperature gradient during the laser warming that occurs during the laser firing ramp up phase or the laser cooling that occurs during the laser firing ramp down phase.

In one embodiment, a method of managing a heat or temperature gradient using one or more thermocouples can be provided that measures heat or temperature gradient. The method can also include using data from the one or more thermocouples in order to operate the one or more heating elements in order to provide the substantially constant heat and/or temperature gradient across the TOSA device before, during, and after firing of the laser of the TOSA as well as during a dormant period between laser firings. Such a method can include measuring heat and/or temperature associated with the one or more heating elements in order to provide data of the heat and/or temperature gradients. The method can include independently or cooperatively measuring heat generation and/or temperature of the one or more heating elements when: (1) turned on and generating heat; (2) set at a certain heat generation level; (3) set at a certain temperature level; and/or (4) turned off and not generating heat. The method can also include generating a heat generation map or temperature map from data from the one or more thermocouples. The heat generation map or temperature map can be used in order for the one or more heating elements to provide a substantially constant heat generation map or temperature map.

In one embodiment, the TOSA can be configured to prevent or remedy or inhibit or stop low frequency wander or thermal chirp that results from direct modulation of a DFB by using the one or more heating elements to maintain heat during dormant periods between laser firing. Voltage may be applied to the one or more heating elements under control of a controller that has data regarding when the laser is being fired or dormant as well as in response to data of thermocouples arranged in the device. A method can also be used to reduce or remove low frequency wander or thermal chirp using the one or more heating elements or other components of the TOSA described herein.

In one embodiment, the TOSA having the one or more heating elements can be operated to provide a substantially constant operating condition, such as a heat generation and/or temperature or gradient thereof, to control or maintain substantially constant operational parameters in electronic or optoelectronic components that are sensitive to heat generation, temperature and changes in heat generation and/or temperature. Laser wavelength is particularly sensitive to changes in temperature, which wavelengths can be maintained so as to be constantly consistent during firing by using the one or more heating elements as described. Constant operation values of active elements (e.g., lasers producing light) and passive elements (e.g., passive bulk optics that perform partial absorption and/or manipulating light properties) can be sensitive to changes in temperature, which active and passive elements can be operated so as to be under substantially constant operating conditions when firing or otherwise operating by using the one or more heating elements as described.

Temperature gradient transient conditions, which can result from heat gradient transient conditions, can change the characteristics of the various components that are included for the operation of a TOSA. However, now, one or more dedicated heating elements can be associated with the laser can regulate the heat generation by providing supplemental heat in order to maintain a substantially constant heat and/or temperature profiles as described herein. The one or more heating elements can also be regulated to provide substantially the same heat generation as a laser, and the heating element can be switched on while the laser is heating, on, off, cooling, and/or dormant to maintain the substantially constant heat and/or temperature profile. The heating elements and laser can be regulated such that the heat generated therefrom is consistent, which can provide consistent heating and temperature profiles to the laser as well as a consistent heat or temperature gradient profiles across the various active and passive components associate with the operation of a TOSA.

In one embodiment, the one or more heating elements can be configured, arranged, and controlled to provide a heat swap, where a first component generating heat is swapped for a second component generating heat in order to maintain heat or temperature profiles. That is, a first component generating heat (e.g., a laser) can be swapped for a second component generating heat (e.g., one or more heating elements) when the first component is turned off or in a dormant mode or any state between firing and dormant that is not steady state. The heat swap can allow for switching heat dissipation from an active element (e.g., laser) to a heating element (e.g., dedicated heating resistor) that is located in, on, or adjacent to the active element. The heating element can be a resistor element and have no other function but to produce heat. The heating element can be controlled to provide heat in order to maintain a heat and/or temperature gradient for the laser as well as across the various components that operate with the laser or for the overall optoelectronic device or TOSA.

In one embodiment, the one or more heating elements can provide for substantially constant heat generation or temperature or gradient thereof to a laser before and during startup. The substantially constant heat generation or temperature or gradient profile thereof can significantly reduce the startup to firing time of a laser, such as a CML TOSA laser. For example, when pre-heated so that the optoelectronic device has the substantially constant heat and/or temperature profile, the laser can fire almost immediately upon command. The can also be useful during dormant periods between laser firing.

In one embodiment, the one or more heating elements can be used to offset changes in heat, temperature, or gradients thereof when the laser is turned off and it cools down. Now, the one or more heating elements can be configured, located, arranged, and controlled so as to be operably coupled with the laser, such as being located next to the laser, in order to maintain the heat and/or temperature profile of the optoelectronic device and of the laser after the laser is turned off. The controller can swap heat generation from laser to the one or more heating elements so that the heat and/or temperature profile of the laser is maintained during dormant periods so as to be similar or the same as when firing.

In one embodiment, the one or more heating elements can also be used to maintain heat load on a thermoelectric cooler, which keeps temperature constant. When the laser turns off, the thermoelectric cooler can exacerbate the heat load or temperature fluctuations. Now, the one or more heating elements can maintain the heat load on the thermoelectric cooler at about the same levels as the laser when firing. When heat load changes from turning off the laser, the one or more heating elements can turn on or be otherwise operated to maintain the heat load on the thermoelectric cooler. Particularly, the one or more heating elements can be configured, located, arranged, and controlled so as to maintain a constant heat load on the laser and/or or thermoelectric cooler as well as other associated components of a TOSA.

The one or more heating elements can be configured, located, arranged, and controlled so as to maintain any temperature gradient across a TOSA or portion thereof. Different electronic or optoelectronic components can have different distances from the laser, and these differences may determine their location on a heat or temperature gradient profile or gradient map thereof. The one or more heating elements can be configured, located (e.g., integrated), arranged, and controlled relative to the laser so as to maintain the temperature gradient across the TOSA with respect to different electronic or optoelectronic components and their relative locations. This configuration allows for the temperature or heat gradient across all of the components can stay reasonably or substantially the same while the laser is firing and dormant or during startup or shutdown.

In one embodiment, a CML TOSA only has one dedicated heating element, such as a resistor. In one aspect, a CML TOSA only has one dedicated heating element associated with the laser.

FIGS. 1, 1A, 2, and 2A provide an example of an operating environment for the heating element configuration of the present invention. Referring to FIG. 1, an optical communication system 10 includes a data source 16 that provides a signal to a laser 12 that emits light that is received by an optical spectrum reshaper (OSR) 14. The system 10 also includes a heating element 11 thermally coupled with the laser 12, and in this instance the heating element 11 is in contact with the laser 12. Also, the output of the OSR 14 is coupled to an optical fiber 18 that transmits the output to an optical receiver 20. In some embodiments, one or more dispersion compensating elements 22 may be used to compensate for dispersion within the fiber 18 of the transmitted signal. A microcontroller 13 is operably coupled to the heater element 11 in order to provide control for being on, off, or heat output or temperature.

In some embodiments, the output of the laser 12 is both frequency modulated and amplitude modulated, such as adiabatically chirped pulses produced by a directly modulated laser 12 embodied as a distributed feedback (DFB) laser, distributed Bragg reflector (DBR) laser, VCSEL, or other semiconductor laser. The output of the OSR 14 may also remain somewhat frequency modulated. In one embodiment, the system 10 is a CML TOSA.

Figure 1A:
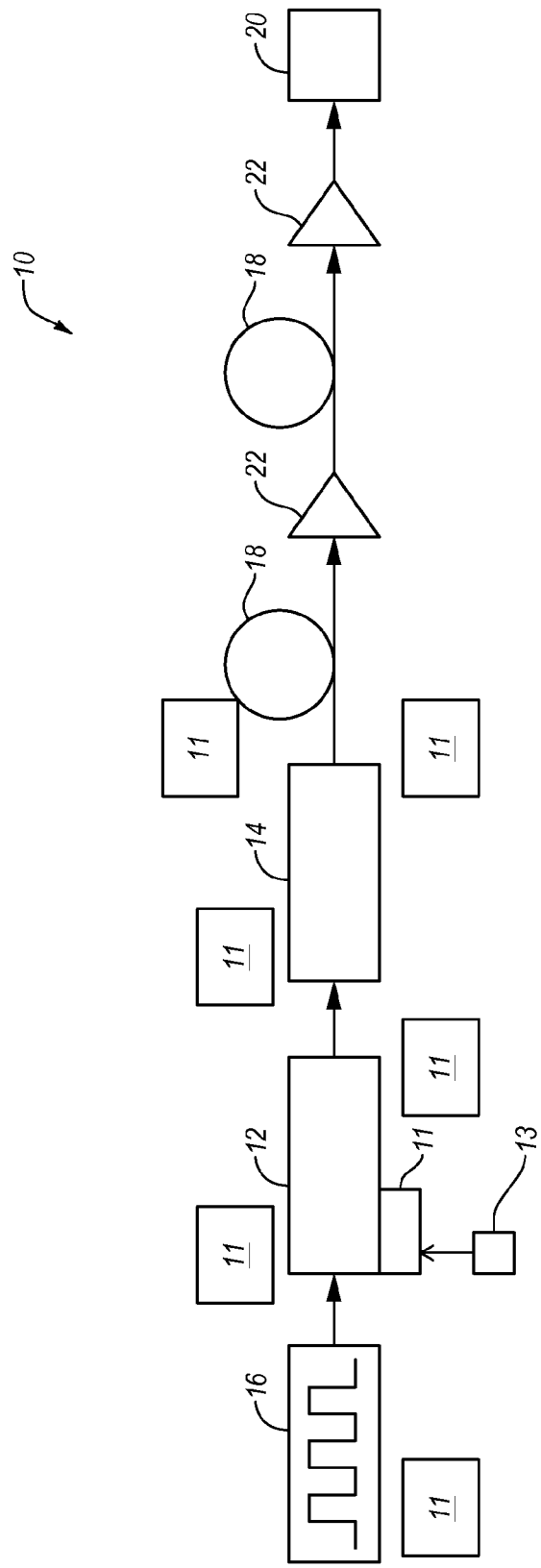
FIG. 1A illustrates an embodiment of an optical communication system having a plurality of heating elements.

FIG. 1A shows a plurality of heating elements 11 arranged in the system 10, which arrangement can provide a substantially constant heat generation or temperature gradient across the system 10. These heating elements 11 can also be operably coupled with the controller 13 or other unique or discrete controllers.

Figure 2:
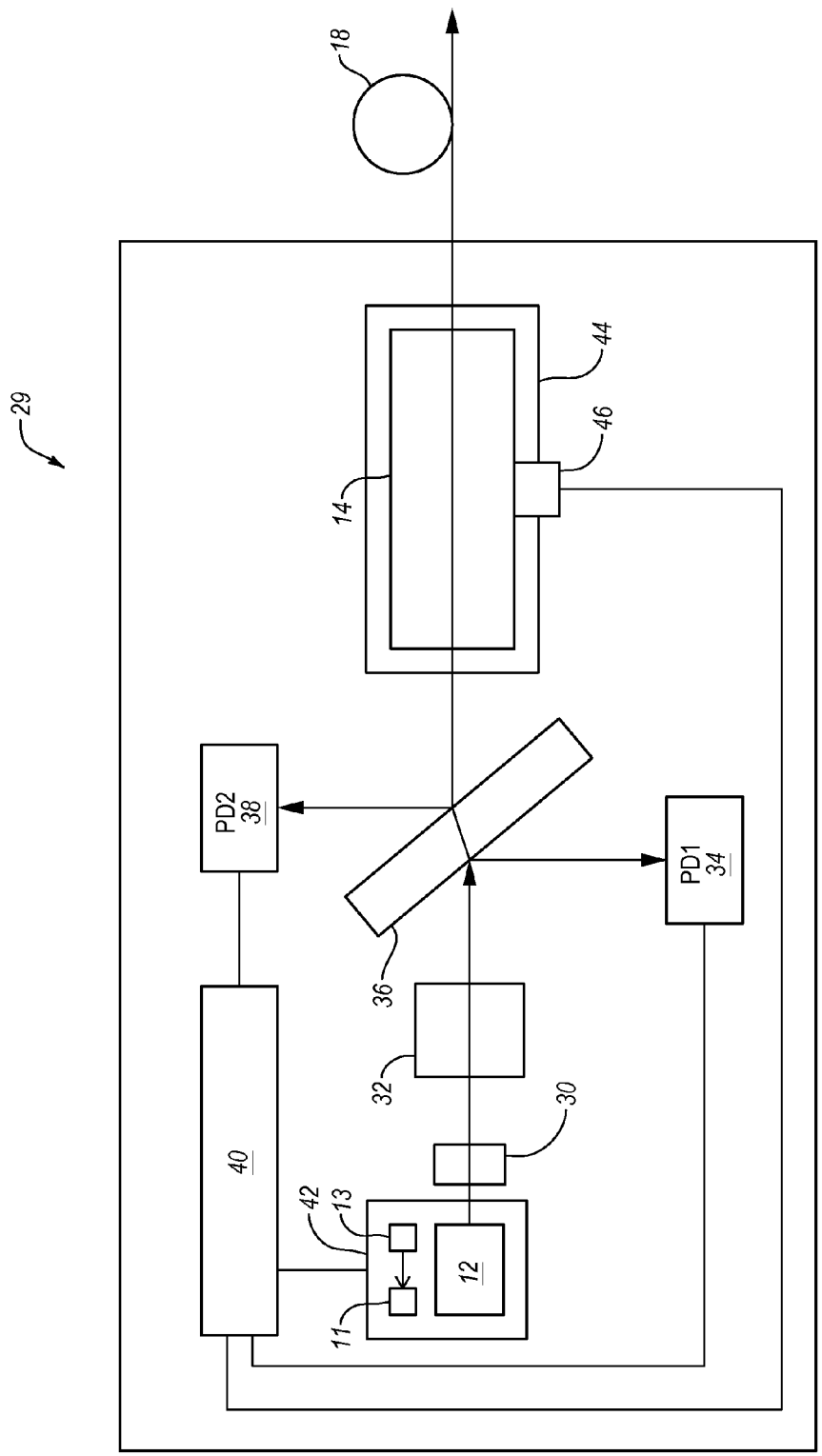
FIG. 2 illustrates an embodiment of an optical transmitter having a single heating element.

Referring particularly to FIG. 2, one example of an optical transmitter 29 is disclosed that may be implemented in the optical communication system 10 of FIG. 1. The optical transmitter 29 may be representative of some optical transmitters distributed by Finisar Corporation as Chirp Managed Laser (CML™) transmitters. In the illustrated embodiment, the optical transmitter 29 includes the laser 12, heating element 11, heating element controller 13, and OSR 14 and the other components described herein.

The OSR 14 may be used to control the wavelength of the laser 12. For example, a collimating lens 30 is used to direct a collimated beam from the laser 12 through an isolator 32. A small fraction (typically 5%) of light from the laser is redirected to a photodetector 34 (e.g., PD1) by a tap beam splitter 36. The tap beam splitter 36 may be produced by depositing an anti-reflection coating on one side of a small piece of polished glass and a second controlled-reflection coating on the opposite side.

In some embodiments of the invention, the portion of the collimated beam passing through the tap beam splitter 36 is incident on the OSR 14. The spectral response of the OSR 14 may be such that non-transmitted light is reflected. Therefore, depending on the location of the lasing wavelength relative to the passband of the OSR 14, a portion of the incident optical beam will be transmitted while a residual portion of the incident beam is reflected. The reflected portion of the beam passes back through the tap beam splitter 36 and a portion of the power, such as about 5%, is diverted onto a second photodetector 38 (e.g., PD2), as shown in FIG. 2.

The frequency alignment between the laser 12 and the OSR 14 is generally implemented by a controller 40 that compares the average optical power before and after the OSR 14. For example, the ratio of photo currents produced by photodetectors 34, 38 may be used to "lock" the relative spectral positions of the laser 12 with respect to the response of the OSR 14. During calibration, the optimal set point for the laser wavelength relative to the OSR spectral response is determined. During operation, the controller 40 then acts to maintain the laser wavelength near this calibrated set point by continuously adjusting the laser temperature via a thermoelectric cooler (TEC) 42 to which it is coupled in response to the currents produced by the photodetectors 34, 38. For example, if the lasing wavelength changes, the ratio of the photo current signals provides an error signature allowing the controller 40 coupled to the TEC 42 to re-adjust the temperature of the laser 12 to maintain the correct wavelength.

In some embodiments, the controller 40 controls the temperature of the OSR 14 to avoid wavelength drift. Optionally, the controller 40 can control the heating element 11, thereby the controller 13 can be removed. For example, the temperature of the OSR 14 may be held substantially constant by controlling power to a TEC 44. The controller 40 may receive an output from a temperature sensor 46 in thermal contact with the OSR 14 in order to control power to the TEC 44 and maintain the OSR 14 at a constant pre-calibrated temperature. The embodiments of the invention can be practiced with the optical transmitter 29 of FIG. 2. As such, the heating element 11 can provide heat to the components so that the heat and/or temperature profile is held substantially constant. For example, the heating element can operate in a controlled manner with the TEC 42 and TEC 44 to control the temperature of the laser 12 and OSR 14.

Figure 2A:
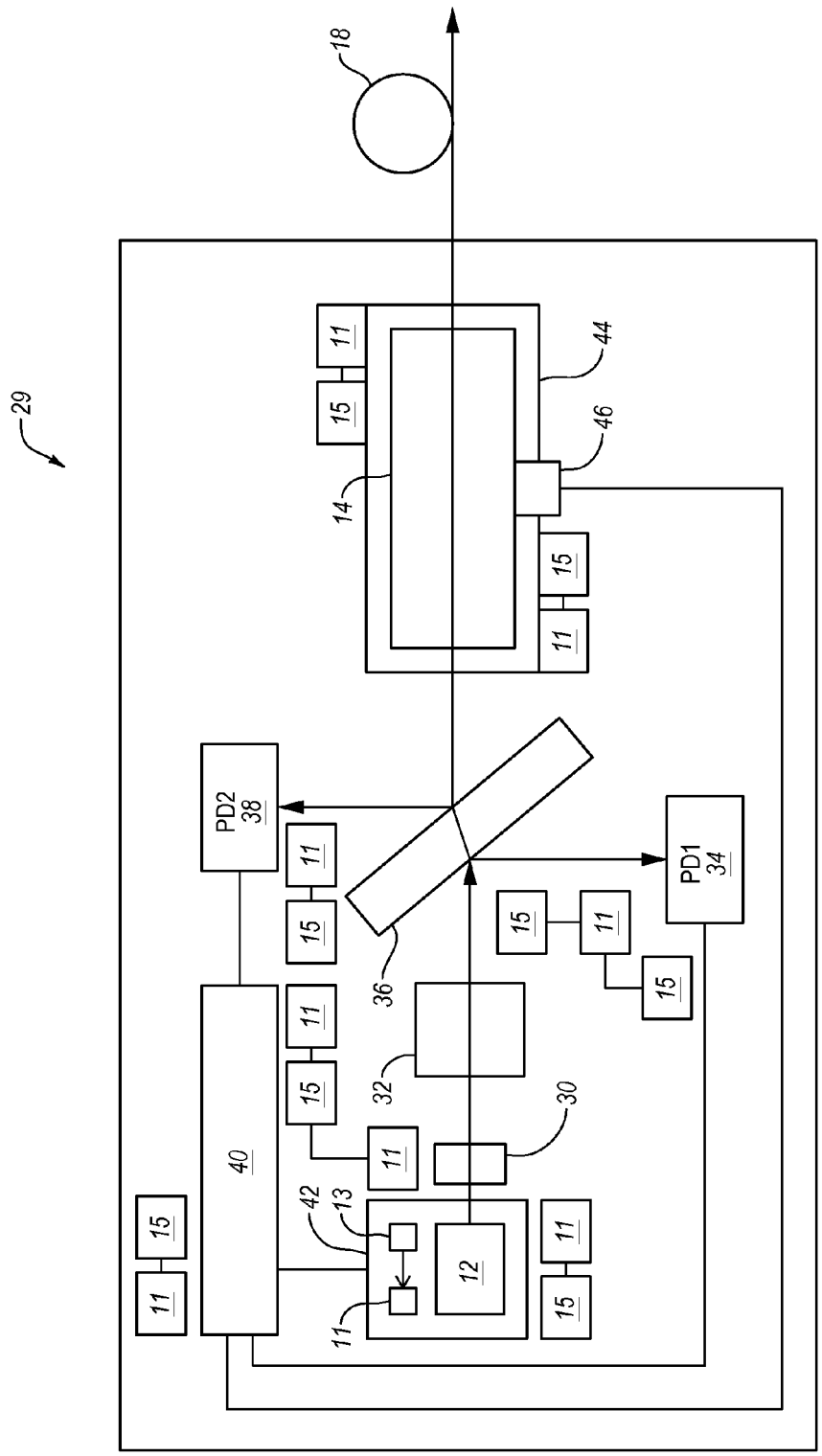
FIG. 2A illustrates an embodiment of an optical transmitter having a plurality of heating elements.

FIG. 2A shows the optical transmitter of FIG. 2 having a plurality of heating elements 11 in accordance with embodiments of the present invention. FIG. 2A also shows thermocouples 15. Of course, the number and location of the individual heating elements 11 and/or thermocouples 15 can be modified as needed or desired for a constant heat generation or temperature gradient. The heating elements 11 thermocouples can be adjacent or otherwise operably coupled or separate and distinct.

Figure 3A:
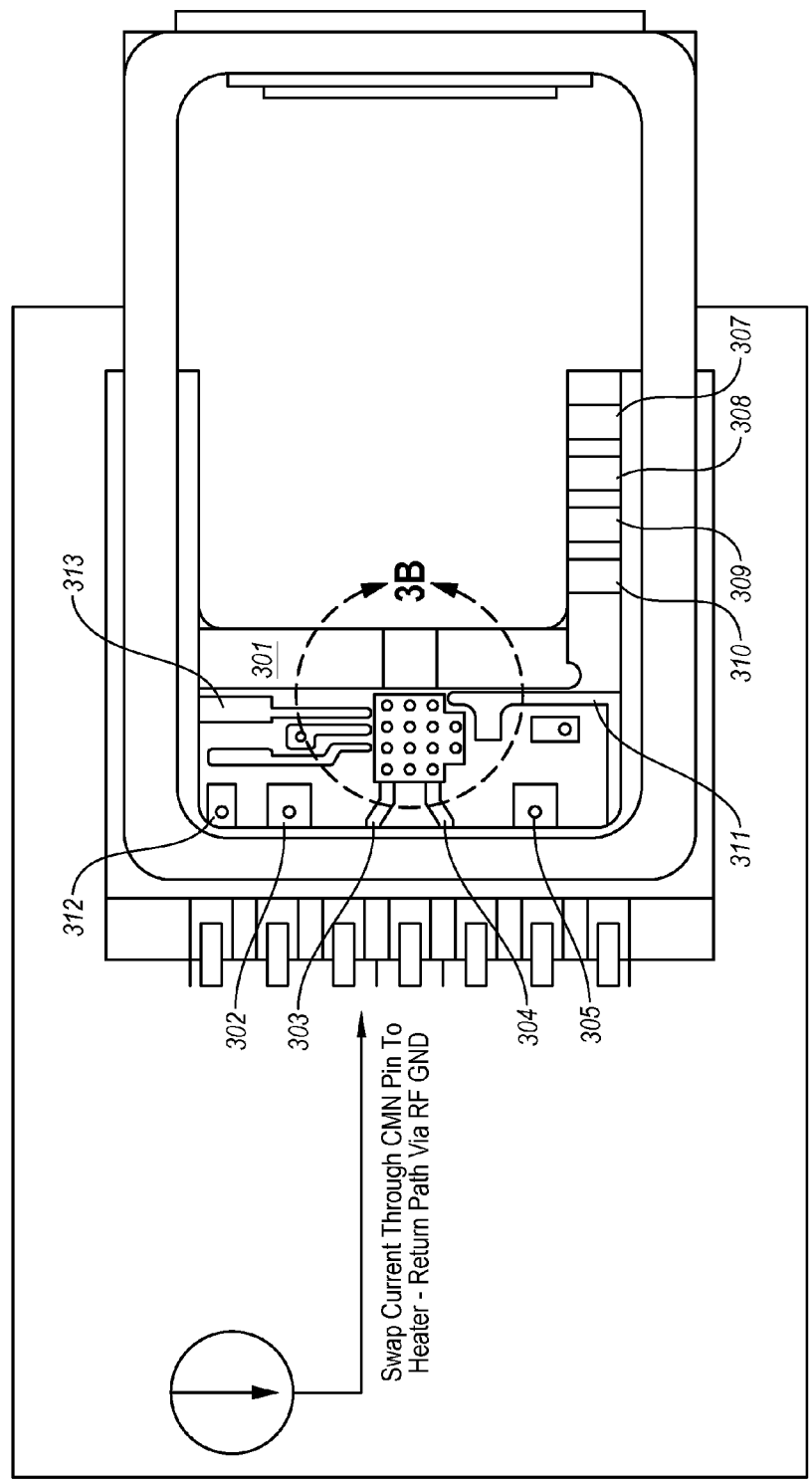
FIG. 3A illustrates an embodiment of an optoelectronic device.
Figure 3B:
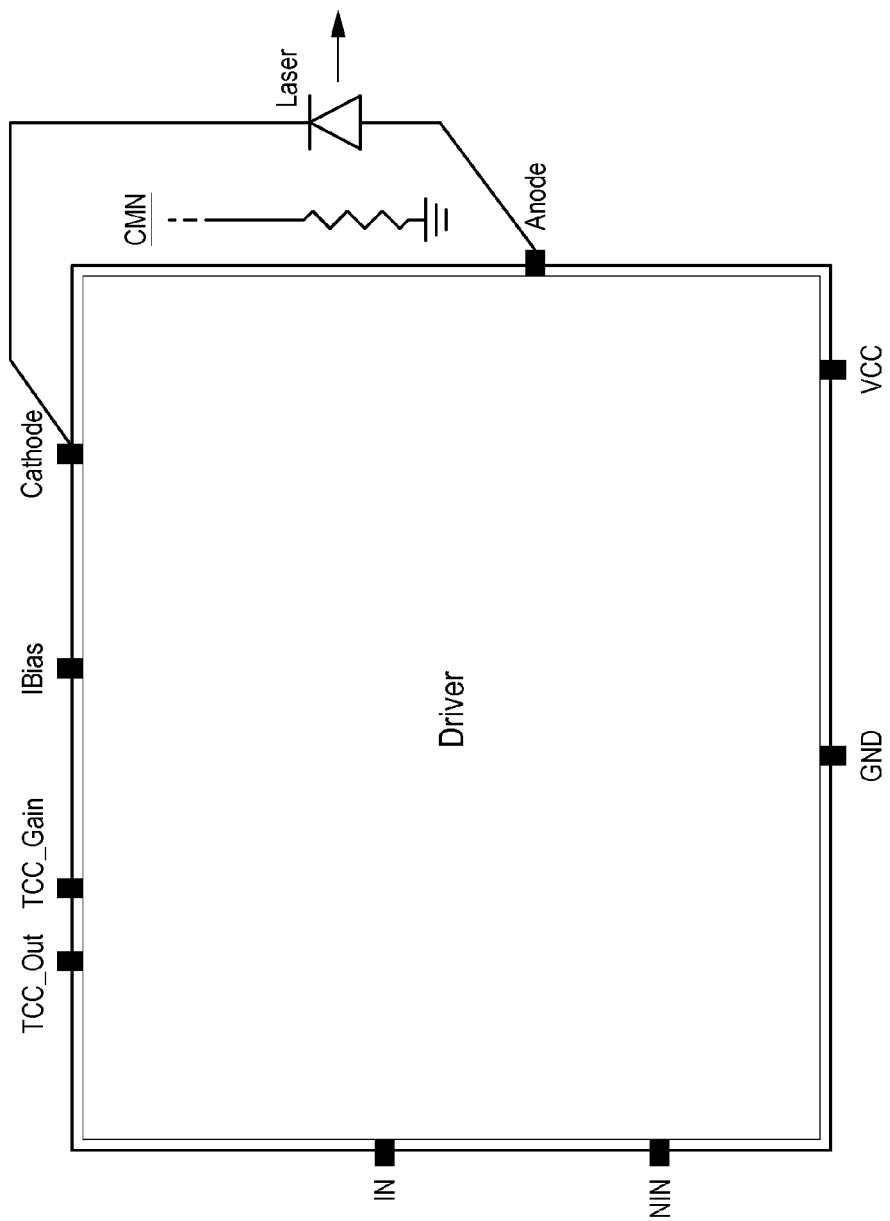
FIG. 3B illustrates an embodiment of an optoelectronic device having a heating element.

FIG. 3A shows components of an optoelectronic device 300 that are common in TOSAs. The optoelectronic device 300 includes a TEC− 301, ground 302, signal+ 303, signal− 304, ground 305, TEC+ (not shown), PD2 307, PD1 308, common 309, thermistor 310, VCC 311, TCC 312, and 313, all arranged as illustrated. FIG. 3B shows the location of the heating element with respect to the laser. As shown, the heater is thermally coupled with the laser.

Figure 4:
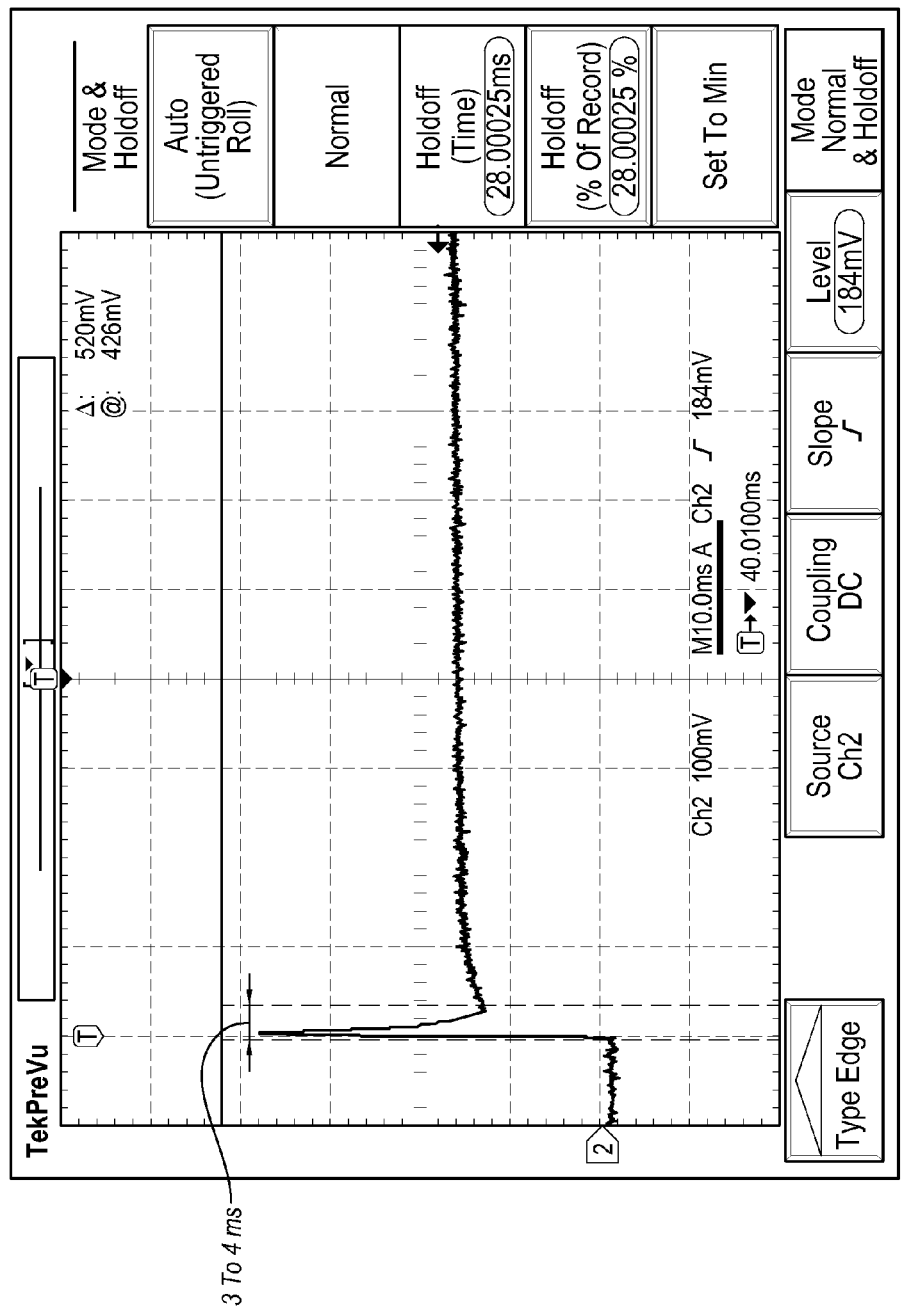
FIG. 4 includes a graph that shows a constant thermo profile provided by a heating element associated with a laser can reduce startup time of the laser begin ready to fire.

FIG. 4 includes a graph that shows constant heat provided by the heater can reduce the startup time of the laser to 3 to 4 milliseconds before firing.

In one example, the one or more heating elements of the present invention can be configured, arranged, and controlled to improve data transmission from a CML TOSA across long distances.

In one example, the one or more heating elements of the present invention can be configured, arranged, and controlled to reduce startup time of a CML TOSA.

In one example, the one or more heating elements of the present invention can be configured, arranged, and controlled to provide a CML TOSA that can fire within 5 milliseconds, 4 milliseconds, 3, milliseconds, or 2 milliseconds of being turned on. This can include initial start of a CML TOSA as well as from a dormant period.

In one embodiment, a TOSA can include: a light emitting element; and one or more heating elements thermally coupled to the light emitting element so as to provide a substantially constant heat generation profile and/or temperature profile across the TOSA during a light emitting element dormant period and a light emitting element firing period. The TOSA can include a controller operably coupled with the one or more heating elements so as to control the substantially constant heat generation profile and/or temperature profile. In one aspect, the one or more heating elements can include one or more dedicated heating elements. In one aspect, the one or more of the dedicated heating elements can include a resistor element or coil.

In one embodiment, the one or more of the heating elements can be in contact with or adjacent to the light emitting element. In one aspect, one or more of the heating elements can be within 1 cm of the light emitting element, or within 5 mm, or within 2 mm, or within 1 mm, or within 0.5 mm, or within 0.25 mm, or within 0.1 mm.

In one embodiment, the TOSA can include one or more TOSA electronic components that are common in TOSAs, and one or more of the heating elements can be thermally coupled to the one or more electronic components. The thermally coupling can be in contact or adjacent, or within 1 cm, or within 5 mm, or within 2 mm, or within 1 mm, or within 0.5 mm, or within 0.25 mm, or within 0.1 mm.

In one embodiment, the TOSA can include one or more thermocouples operably coupled with the controller. The thermocouples can provide thermocouple data to the controller. When multiple controllers are used, the thermocouple data can be provided to the multiple controllers. Each controller can control heating of one or more heating elements. In one aspect, the one or more thermocouples are in contact with or adjacent to the one or more heating elements.

In one embodiment, the TOSA can include one or more thermoelectric coolers with one or more of the heating elements thermally coupled with the one or more thermoelectric coolers. The heating elements can be heated and adjusted to provide heat to counteract cooling by the thermoelectric coolers, such as when the laser is ramping down or dormant. The one or more thermoelectric coolers can be in contact with or adjacent to the one or more heating elements, or within 1 cm, or within 5 mm, or within 2 mm, or within 1 mm, or within 0.5 mm, or within 0.25 mm, or within 0.1 mm.

In one embodiment, a method of controlling temperature of a TOSA can include: heating one or more heating elements so as to provide a substantially constant heat generation profile and/or temperature profile across the TOSA during a light emitting element dormant period and a light emitting element firing period.

In one embodiment, the temperature control method can include: emitting light from a light emitting element during the light emitting element firing period; ending the light emitting element firing period so that the light emitting element begins to cool during the light emitting element dormant period; and activating the one or more heating elements during the light emitting element dormant period so as to maintain the substantially constant heat generation profile and/or temperature profile across the TOSA.

In one embodiment, the temperature control method can include identifying the substantially constant heat generation profile and/or temperature profile across the TOSA; and adjusting heat emitted from the one or more heating elements during the light emitting element dormant period and/or a light emitting element firing period so as to maintain the substantially constant heat generation profile and/or temperature profile across the TOSA.

In one embodiment, the temperature control method can include: turning on the TOSA; heating the one or more heating elements so as to obtain the substantially constant heat generation profile and/or temperature profile across the TOSA prior to a first light emitting element firing period; and firing a light emitting element after reaching the substantially constant heat generation profile and/or temperature profile across the TOSA.

In one embodiment, the temperature control method can include firing a light emitting element during a first light emitting element firing period so as to provide the substantially constant heat generation profile and/or temperature profile across the TOSA; and mapping the substantially constant heat generation profile and/or temperature profile across the TOSA.

In one embodiment, the temperature control method can include: monitoring a first heat generation profile and/or temperature profile across the TOSA; and adjusting heat emitted from the one or more heating elements during the light emitting element dormant period and/or a light emitting element firing period so as to maintain the substantially constant heat generation profile and/or temperature profile across the TOSA.

In one embodiment, the temperature control method can include: firing a light emitting element at a steady state firing period; identifying the substantially constant heat generation profile and/or temperature profile across the TOSA at the steady state; and adjusting heat emitted from the one or more heating elements during a non-steady state firing period so as to maintain the substantially constant heat generation profile and/or temperature profile across the TOSA.

In one embodiment, the temperature control method can include: adjusting heat emitted from the one or more heating elements so as to maintain heat load on a thermoelectric cooler and maintain the substantially constant heat generation profile and/or temperature profile across the TOSA during the light emitting element dormant period and the light emitting element firing period.

In one embodiment, a method of controlling temperature of a TOSA can include: providing the TOSA having one or more heating elements thermally coupled with a light emitting element, one or more thermocouples, and one or more controllers; firing the light emitting element during a steady state light emitting element firing period; measuring with the one or more thermocouples a heat generation profile and/or temperature profile across the TOSA during the steady state light emitting element firing period; providing thermocouple data from the one or more thermocouples to the one or more controllers during the steady state light emitting element firing period; identifying a substantially constant heat generation profile and/or temperature profile across the TOSA at the steady state light emitting element firing period; and heating one or more heating elements under control of the one or more controllers so as to provide a substantially constant heat generation profile and/or temperature profile across the TOSA during non-steady state light emitting element firing period or a light emitting element dormant period.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims.

The present disclosure is to be limited only by the terms of the appended claims, along with the full scope of equivalents to which such claims are entitled. It is also to be understood that the terminology used herein is for the purpose of describing particular embodiments only, and is not intended to be limiting. All references recited herein are incorporated herein by specific reference in their entirety.

The invention claimed is:

1. A transmitting optical sub-assembly (TOSA) comprising:
    a light emitting element;
    one or more heating elements thermally coupled to the light emitting element so as to provide a substantially constant heat generation profile and/or temperature profile across the TOSA during a light emitting element dormant period and a light emitting element firing period;
    a thermoelectric cooler thermally coupled with at least one of the one or more heating elements so as to provide a heat load on the thermoelectric cooler during the light emitting element dormant period and/or the light emitting element firing period;
    a controller operably coupled with the one or more heating elements so as to control the substantially constant heat generation profile and/or temperature profile; and
    one or more thermocouples thermally coupled with the one or more heating elements and operably coupled with the controller,
    wherein the TOSA has a constant heat generation profile and/or temperature profile with respect to the light emitting element and one or more TOSA components during the light emitting element dormant period and the light emitting element firing period.

2. The TOSA of claim 1, wherein the one or more heating elements includes one or more dedicated heating elements.

3. The TOSA of claim 2, wherein the one or more of the dedicated heating elements includes a resistor element or coil.

4. The TOSA of claim 1, wherein one or more of the heating elements is in contact with or adjacent to the light emitting element.

5. The TOSA of claim 4, wherein one or more of the heating elements is within 1 mm of the light emitting element.

6. The TOSA of claim 1, comprising:
    one or more TOSA electronic components; and
    one or more of the heating elements thermally coupled to the one or more electronic components.

7. The TOSA of claim 1, wherein the one or more thermocouples are in contact with or adjacent to the one or more heating elements.

8. The TOSA of claim 1, wherein the thermoelectric cooler is in contact with or adjacent to the at least one of the one or more heating elements.

9. The TOSA of claim 1, wherein the TOSA is a chirp managed laser TOSA (CML TOSA).

10. A method of controlling temperature of a transmitting optical subassembly (TOSA), the method comprising:
    providing the TOSA of claim 1; and
    heating the one or more heating elements so as to provide the substantially constant heat generation profile and/or temperature profile across the TOSA during the light emitting element dormant period and the light emitting element firing period.

11. The method of claim 10, comprising:
    emitting light from the light emitting element during the light emitting element firing period;
    ending the light emitting element firing period so that the light emitting element begins to cool during the light emitting element dormant period; and
    activating the one or more heating elements during the light emitting element dormant period so as to maintain the substantially constant heat generation profile and/or temperature profile across the TOSA.

12. The method of claim 10, comprising:
    identifying the substantially constant heat generation profile and/or temperature profile across the TOSA; and
    adjusting heat emitted from the one or more heating elements during the light emitting element dormant period and/or a light emitting element firing period so as to maintain the substantially constant heat generation profile and/or temperature profile across the TOSA.

13. The method of claim 10, comprising:
    turning on the TOSA;
    heating the one or more heating elements so as to obtain the substantially constant heat generation profile and/or temperature profile across the TOSA prior to a first light emitting element firing period; and
    firing a light emitting element after reaching the substantially constant heat generation profile and/or temperature profile across the TOSA.

14. The method of claim 10, comprising:
    firing a light emitting element during a first light emitting element firing period so as to provide the substantially constant heat generation profile and/or temperature profile across the TOSA; and
    mapping the substantially constant heat generation profile and/or temperature profile across the TOSA.

15. The method of claim 10, comprising:
    monitoring a first heat generation profile and/or temperature profile across the TOSA; and
    adjusting heat emitted from the one or more heating elements during the light emitting element dormant period and/or a light emitting element firing period so as to maintain the substantially constant heat generation profile and/or temperature profile across the TOSA.

16. The method of claim 10, comprising:
firing a light emitting element at a steady state firing period;
identifying the substantially constant heat generation profile and/or temperature profile across the TOSA at the steady state; and
adjusting heat emitted from the one or more heating elements during a non-steady state firing period so as to maintain the substantially constant heat generation profile and/or temperature profile across the TOSA.

17. The method of claim 10, comprising:
adjusting heat emitted from the one or more heating elements so as to maintain heat load on the thermoelectric cooler and maintain the substantially constant heat generation profile and/or temperature profile across the TOSA during the light emitting element dormant period and the light emitting element firing period.

18. A method of controlling temperature of a transmitting optical sub-assembly (TOSA), the method comprising:
providing the TOSA having one or more heating elements thermally coupled with a light emitting element, one or more thermocouples, and one or more controllers;
firing the light emitting element during a steady state light emitting element firing period;
measuring with the one or more thermocouples a heat generation profile and/or temperature profile across the TOSA during the steady state light emitting element firing period;
providing thermocouple data from the one or more thermocouples to the one or more controllers during the steady state light emitting element firing period;
identifying a substantially constant heat generation profile and/or temperature profile across the TOSA at the steady state light emitting element firing period; and
heating one or more heating elements under control of the one or more controllers so as to provide a substantially constant heat generation profile and/or temperature profile across the TOSA during a non-steady state light emitting element firing period and a light emitting element dormant period.

* * * * *